(12) United States Patent
Xu et al.

(10) Patent No.: US 12,550,434 B2
(45) Date of Patent: Feb. 10, 2026

(54) ARRAY SUBSTRATE, DISPLAY PANEL AND DISPLAY DEVICE INCLUDING NON-DISPLAY AREA ELECTRICALLY CONNECTED POWER SIGNAL LINES

(71) Applicant: KunShan Go-Visionox Opto-Electronics Co., Ltd., Jiangsu (CN)

(72) Inventors: Chuanzhi Xu, Kunshan (CN); Lu Zhang, Kunshan (CN); Siming Hu, Kunshan (CN); Zhenzhen Han, Kunshan (CN)

(73) Assignee: KunShan Go-Visionox Opto-Electronics Co., Ltd., Kunshan (CN)

( * ) Notice: Subject to any disclaimer, the term of this patent is extended or adjusted under 35 U.S.C. 154(b) by 752 days.

(21) Appl. No.: 17/683,495

(22) Filed: Mar. 1, 2022

(65) Prior Publication Data

US 2022/0181357 A1    Jun. 9, 2022

Related U.S. Application Data

(63) Continuation of application No. PCT/CN2021/078033, filed on Feb. 26, 2021.

(30) Foreign Application Priority Data

Mar. 27, 2020  (CN) .......................... 202010230839.X (51) Int. Cl.
*H10D 86/60* (2025.01)
*H10D 86/40* (2025.01)
*H10K 59/131* (2023.01)

(52) U.S. Cl.
CPC ........... *H10D 86/60* (2025.01); *H10D 86/441* (2025.01); *H10K 59/131* (2023.02)

(58) Field of Classification Search
CPC . H10K 59/131; H01L 27/124; H01L 27/1218; G09F 9/00; H10D 86/60; H10D 86/441; H10D 86/411
See application file for complete search history.

(56) References Cited

U.S. PATENT DOCUMENTS 9,940,888 B2 *   4/2018  Ryoo .................. G09G 3/3648
10,490,620 B1 * 11/2019  Lai ....................... H10K 59/131
(Continued)

FOREIGN PATENT DOCUMENTS

CN    102891164 A     1/2013
CN    107293567 A    10/2017
(Continued)

OTHER PUBLICATIONS

International Search Report mailed on May 14, 2021, in corresponding to International Application No. PCT/CN2021/078033; 8 pages (with English Translation).

(Continued)

*Primary Examiner* — Ida M Soward
(74) *Attorney, Agent, or Firm* — Maier & Maier, PLLC (57) ABSTRACT

An array substrate includes a light-transmitting area, a non-display area around the light-transmitting area, and a display area around the non-display area. The display area includes power signal lines. The power signal lines include first power signal lines and second power signal lines. The first power signal lines extend to the non-display area, and the second power signal lines are disposed around the light-transmitting area through the non-display area, and are electrically connected to the first power signal lines in the non-display area.

18 Claims, 8 Drawing Sheets

(56) References Cited

U.S. PATENT DOCUMENTS

| | | | | |
|---|---|---|---|---|
| 10,586,813 | B2* | 3/2020 | Xu | H10D 86/60 |
| 10,831,075 | B2* | 11/2020 | Shirai | G02F 1/136286 |
| 10,847,599 | B2* | 11/2020 | Jeon | H10K 59/1216 |
| 10,884,305 | B2* | 1/2021 | Yoshida | G06F 3/0443 |
| 10,923,028 | B2* | 2/2021 | Lin | G02F 1/136286 |
| 10,962,851 | B1* | 3/2021 | Ouyang | G02F 1/136227 |
| 10,964,771 | B2* | 3/2021 | Lee | G09G 3/3233 |
| 11,011,595 | B2* | 5/2021 | Lee | H10K 50/841 |
| 11,100,858 | B2* | 8/2021 | An | G09G 3/3233 |
| 11,114,523 | B2* | 9/2021 | Park | G09G 3/3225 |
| 11,152,449 | B2* | 10/2021 | Park | H10K 77/10 |
| 11,177,337 | B2* | 11/2021 | Seo | G09G 3/3225 |
| 11,181,787 | B2* | 11/2021 | Chu | G06F 3/0443 |
| 11,282,900 | B2* | 3/2022 | An | G09G 3/3225 |
| 11,450,277 | B2* | 9/2022 | An | G09G 3/3233 |
| 11,515,385 | B2* | 11/2022 | Park | H10K 59/40 |
| 11,527,600 | B2* | 12/2022 | Kim | H10K 59/80 |
| 11,687,126 | B2* | 6/2023 | Chang | G06F 1/1688 |
| | | | | 345/156 |
| 11,852,938 | B2* | 12/2023 | Yeh | G09G 3/3233 |
| 2008/0225216 | A1* | 9/2008 | Shimodaira | G02F 1/1362 |
| | | | | 349/143 |
| 2009/0051636 | A1* | 2/2009 | Natori | G09G 3/3648 |
| | | | | 345/55 |
| 2010/0053058 | A1* | 3/2010 | Nagashima | G09G 3/36 |
| | | | | 345/98 |
| 2010/0060842 | A1* | 3/2010 | Igeta | G02F 1/13394 |
| | | | | 349/155 |
| 2014/0197428 | A1* | 7/2014 | Wang | G07F 17/3211 |
| | | | | 257/88 |
| 2017/0162637 | A1* | 6/2017 | Choi | G09G 3/3225 |
| 2017/0287992 | A1* | 10/2017 | Kwak | G06F 1/1652 |
| 2017/0294502 | A1* | 10/2017 | Ka | H10K 59/1213 |
| 2018/0157362 | A1* | 6/2018 | Kim | G06F 3/0412 |
| 2019/0051670 | A1* | 2/2019 | Bei | H10D 86/60 |
| 2019/0109184 | A1* | 4/2019 | Li | G06F 1/163 |
| 2019/0164954 | A1* | 5/2019 | Yang | H10D 86/441 |
| 2019/0261512 | A1* | 8/2019 | Huang | H05K 1/115 |
| 2020/0058728 | A1* | 2/2020 | Song | H10K 59/1315 |

FOREIGN PATENT DOCUMENTS

| | | | | |
|---|---|---|---|---|
| CN | 107910352 | A | 4/2018 | |
| CN | 207217013 | U | 4/2018 | |
| CN | 109064904 | A | 12/2018 | |
| CN | 109087590 | A * | 12/2018 | G09F 9/30 |
| CN | 109143645 | A | 1/2019 | |
| CN | 109541867 | A | 3/2019 | |
| CN | 109585519 | A | 4/2019 | |
| CN | 109817643 | A | 5/2019 | |
| CN | 110289299 | A | 9/2019 | |
| CN | 110297365 | A | 10/2019 | |
| CN | 110675744 | A | 1/2020 | |
| CN | 110707099 | A | 1/2020 | |
| CN | 110780501 | A | 2/2020 | |
| CN | 111402716 | A | 7/2020 | |

OTHER PUBLICATIONS

First Chinese Office Action issued on Apr. 12, 2021; in corresponding to Chinese Application No. 202010230839.X; 22 pages (with Machine Translation).

* cited by examiner

ARRAY SUBSTRATE, DISPLAY PANEL AND DISPLAY DEVICE INCLUDING NON-DISPLAY AREA ELECTRICALLY CONNECTED POWER SIGNAL LINES

CROSS-REFERENCE TO RELATED APPLICATION

This is a continuation of International Patent Application No. PCT/CN2021/078033, filed Feb. 26, 2021, which claims priority to Chinese Patent Application No. 202010230839.X filed with the CNIPA on Mar. 27, 2020, the disclosure of which is incorporated herein by reference in its entirety.

TECHNICAL FIELD

The present disclosure relates to the field of display technologies and, in particular, to an array substrate, a display panel and a display device.

BACKGROUND

The current display panel is developing in a direction of full screen. In the full screen, the display area needs to be provided with openings for placing structures, such as a camera and the like. However, the openings block a power signal line so that the display area around the openings has poor uniformity.

SUMMARY

The present disclosure provides an array substrate, a display panel, and a display device to improve the display uniformity of the array substrate.

The present disclosure provides an array substrate. The array substrate includes a light-transmitting area, a non-display area around the light-transmitting area, and a display area around the non-display area.

The display area includes power signal lines. The power signal lines include first power signal lines and second power signal lines. The first power signal lines extend in a first direction and the second power signal lines extend in a second direction. The first power signal lines extend to the non-display area, and the second power signal lines are disposed around the light-transmitting area through the non-display area and are electrically connected to the first power signal lines in the non-display area. The first direction intersects with the second direction.

The present disclosure further provides a display panel. The display panel includes the array substrate of any embodiment of the present disclosure.

The present disclosure further provides a display device. The display device includes the display panel of any embodiment of the present disclosure.

According to the technical solutions of the embodiments of the present disclosure, the first power signal line is extended to the non-display area, the second power signal line is disposed around the light-transmitting area through the non-display area, and is electrically connected to the first power signal line in the non-display area, so that the power signals inputting from one ends of the power signal lines into the non-display area can be shunted at the overlapping positions of the first power signal lines and the second power signal lines in the non-display area, so that the power signals flowing around the light-transmitting area are relatively uniform, thereby improving the display uniformity around the light-transmitting area, improving the mura phenomenon around the light-transmitting area, and further improving the display effect around the light-transmitting area of the array substrate.

DETAILED DESCRIPTION

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

Figure 1:
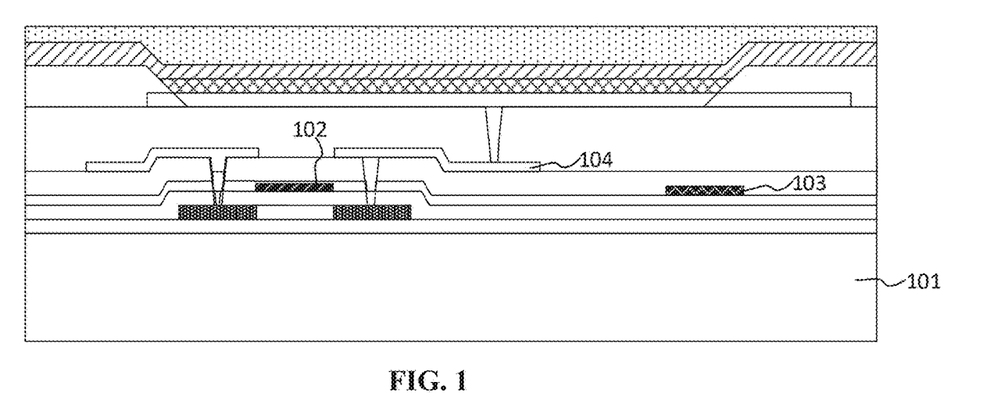
FIG. 1 is a sectional view of a display panel.
Figure 2:
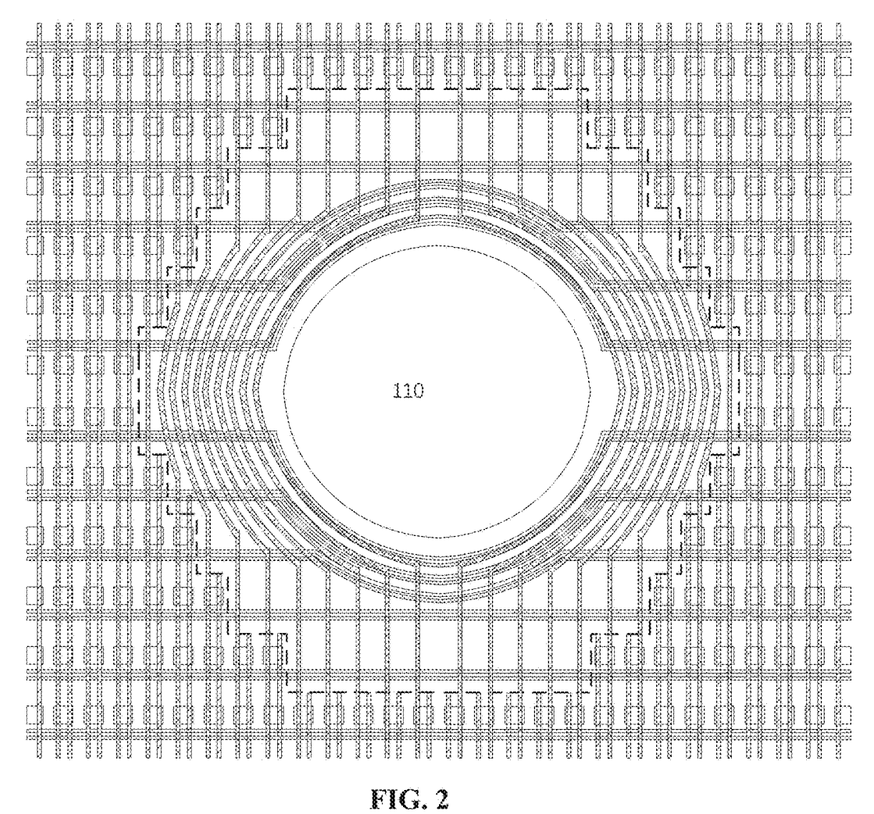
FIG. 2 is a top view of a display panel.
Figure 3:
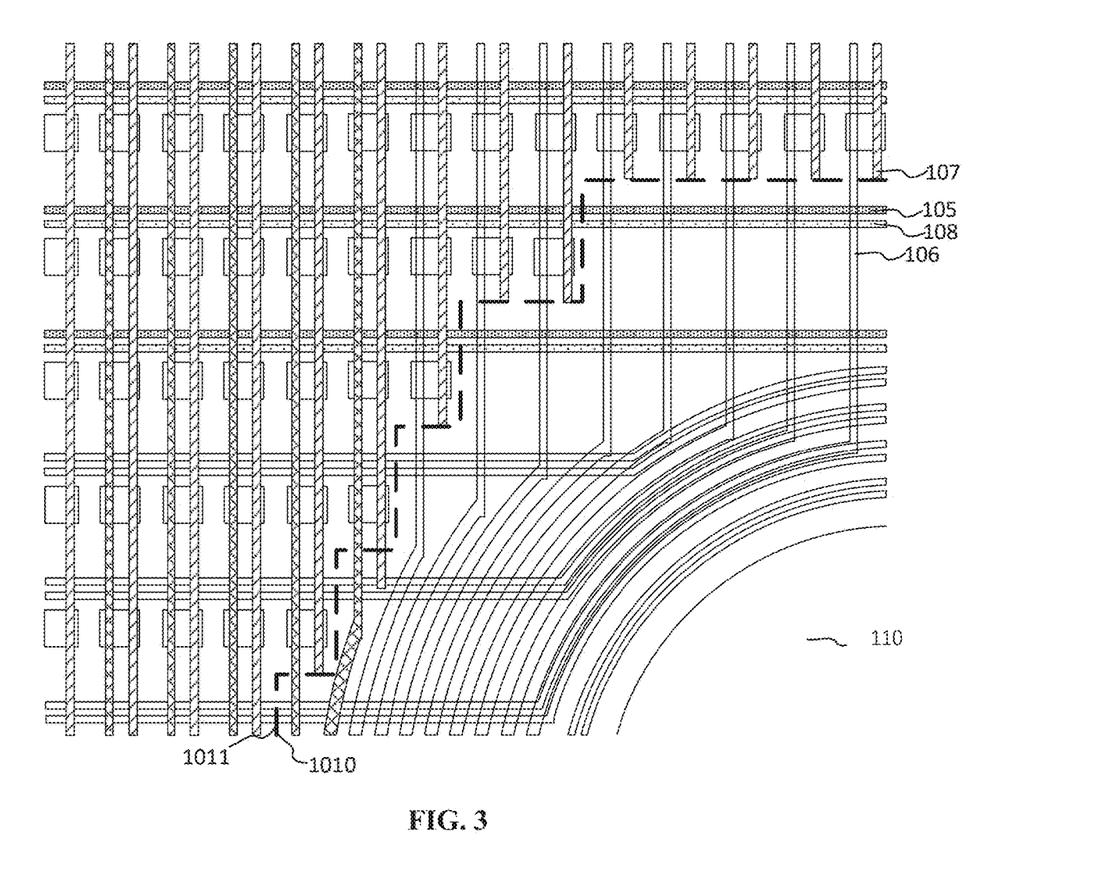
FIG. 3 is a partial enlarged view of FIG. 2.

The display panel includes multiple power signal lines, each power signal line provides a positive voltage for a column of pixel units to drive the pixel units to emit light. FIG. 1 is a sectional view of a display panel. FIG. 2 is a top view of a display panel. FIG. 3 is a partial enlarged view of FIG. 2.

As shown in FIGS. 1 to 3, the display panel includes a substrate 101, a gate metal layer 102, a capacitive metal layer 103, and a source and drain layer 104. In a direction facing away from the substrate 101, a scanning signal line 105 may be disposed in a same layer as the gate metal layer 102, and a capacitive plate for forming a capacitor may be disposed in a same layer as the capacitive metal layer 103. Multiple data lines 106 and multiple power signal lines 107 may be disposed in a same layer as the source and drain layer 104. Since the power signal line has a voltage drop and in the pixel circuit, the capacitor is electrically connected to the power signal lines 107, metal traces 108 may be provided on the capacitive metal layer 103, an extension direction of the metal traces 108 intersects an extension direction of the power signal lines 107, and the metal traces 108 are electrically connected to the power signal lines 107 at respective intersections, so that the power signals provided by the power signal lines 107 flow in a grid form in the display panel, and the uniformity of the power signals of the pixel units at different positions in the display panel is improved. In this way, the display uniformity of the display panel is improved. In a case where a display area of the display panel is provided with a light-transmitting area 110, a non-display area 1010 (i.e., an area within a dotted line) is provided around the light-transmitting area 110, and the scanning signal line 105 and the data line 106 achieve signal connection on both sides of the light-transmitting area 110 through the non-display area 1010, thereby implementing the normal display of the display panel. Due to the large number of data lines 106, to achieve a narrow bezel design around the light-transmitting area 110, the metal traces 108 of the capacitive metal layer 103 or the power signal lines 107 may be broken in the non-display area 1010, that is, the metal traces 108 of the capacitive metal layer 103 or the power signal lines 107 are not provided in the non-display area 1010 around the light-transmitting area 110, and the power signals on both sides of the light-transmitting area 110 are provided through the metal traces 108 and the power signal lines 107 at other positions. However, in the case where the power signals are input into one ends of the power signal lines 107, since the power signal lines 107 and/or the metal traces 108 of the capacitive metal layer 103 in the non-display area 1010 around the light-transmitting area 110 are broken, compared with the power signals provided for the pixel units by a grid path in other parts, the power signals provided for the pixel units (the pixel units in a part of the display area 1011 indicated by the dotted-line box in FIG. 3) on a side of the light-transmitting area 110 facing away from the side of inputting the power signals can be input through only the power signal lines 107 or the metal traces 108 of the capacitive metal layer 103, resulting in different voltage drops at different positions, causing the power signals to be uneven, thereby causing the uneven display of the pixel units around the light-transmitting area 110 and reducing the display effect of the display panel.

Figure 4:
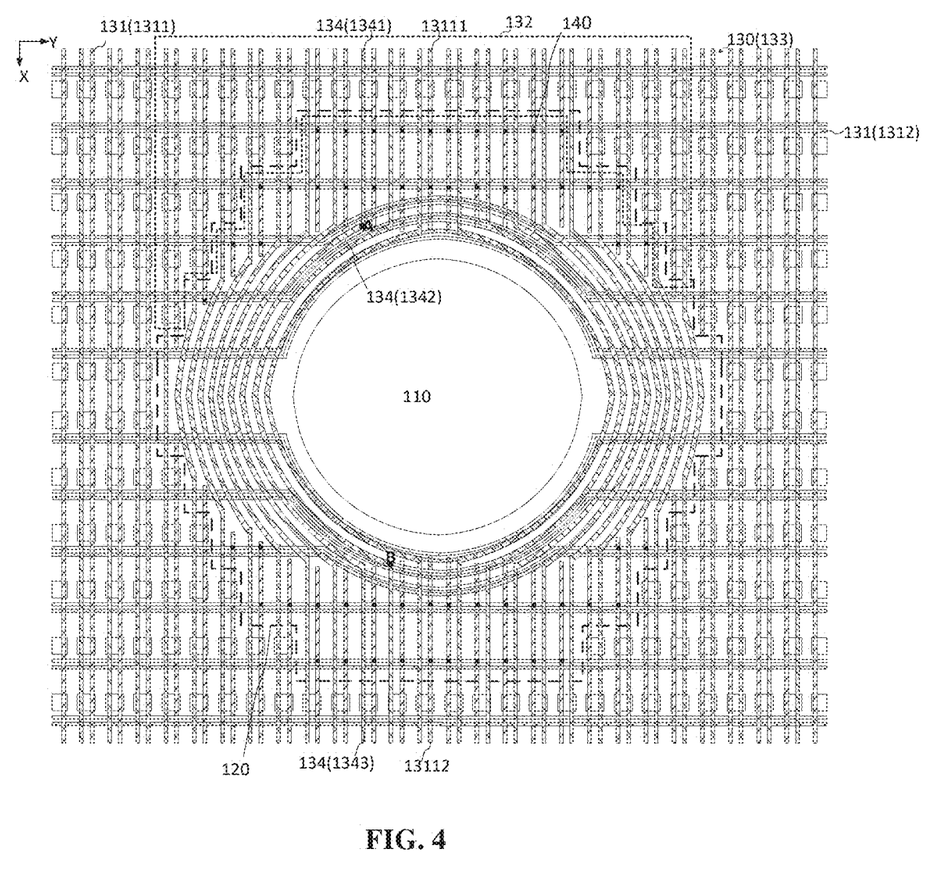
FIG. 4 is a top view of an array substrate provided by an embodiment of the present disclosure.
Figure 5:
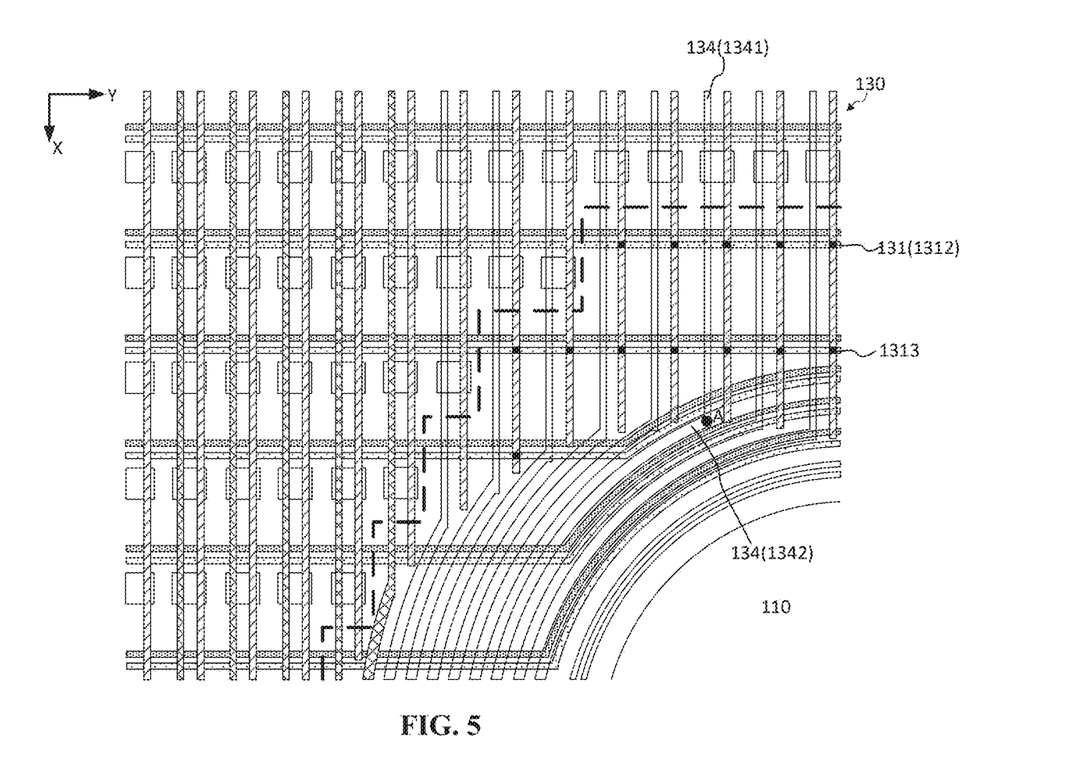
FIG. 5 is a partial enlarged view of FIG. 4.

In view of the above technical problems, an embodiment of the present disclosure provides an array substrate. FIG. 4 is a top view of an array substrate provided by an embodiment of the present disclosure, and FIG. 5 is a partial enlarged view of FIG. 4. As shown in FIGS. 4 and 5, the array substrate includes a light-transmitting area 110, a non-display area 120 around the light-transmitting area 110, and a display area 130 around the non-display area 120. The display area 130 includes power signal lines 131. The power signal lines 131 include first power signal lines 1311 and second power signal lines 1312. The first power signal lines 1311 extend in a first direction X and the second power signal lines 1312 extend in a second direction Y. The first power signal lines 1311 extend to the non-display area 120, the second power signal lines 1312 are disposed around the light-transmitting area 110 through the non-display area 120, and are electrically connected to the first power signal lines 1311 in the non-display area 120. The first direction X intersects with the second direction Y The light-transmitting area 110 is an area whose light transmittance is larger than the light transmittance of the display area 130. For example, the light-transmitting area 110 may be a through-hole area, that is, the array substrate has a through hole in the light-transmitting area 110.

The light-transmitting area 110 may also be a blind-hole area, that is, the array substrate has holes with the substrate reserved in the light-transmitting area 110. The first power signal lines 1311 and the second power signal lines 1312 may be used for providing the power signals for the pixel units. Exemplarily, the first power signal lines 1311 may be disposed in the source and drain layer of the array substrate, and the second power signal lines 1312 may be disposed in the capacitive metal layer of the array substrate. The display area 130 includes a first display area 132 and a second display area 133. The first display area 132 is a display area on a side of the light-transmitting area 110 facing away from a side into which the power signals flow, and the second display area 133 is a display area in the display area 130 other than the first display area 132. The extension direction of the first power signal lines 1311 intersects with the extension direction of the second power signal lines 1312 to form a grid, and the first power signal lines 1311 and the second power signal lines 1312 are electrically connected at the overlapping positions in the grid so that the voltage drops are the same at different positions in obtaining the power signals in the second display area 133, so that the pixel units in the second display area 133 can be provided with uniform power signals to ensure the display uniformity of the pixel units in the second display area 133.

In addition, the second power signal lines 1312 are disposed around the light-transmitting area 110 through the non-display area 120, that is, the second power signal lines 1312 extend from the non-display area 120 to the display area 130 and are each electrically connected to a row or column of pixel units. The first power signal lines 1311 have extension lines in the non-display area 120 so that the first power signal lines 1311 and the second power signal lines 1312 overlap in the non-display area 120 to achieve electrical connection. Thus, the power signals inputting from one ends of the power signal lines into the non-display area can be shunted at overlapping positions of the first power signal lines 1311 and the second power signal lines 1312 in the non-display area 120, so that the power signals flowing into the first display area 132 are relatively uniform, thereby improving the display uniformity of the pixel units of the first display area 132, improving the mura phenomenon around the light-transmitting area 110, and further improving the display effect around the light-transmitting area 110 of the array substrate.

Based on the preceding technical solutions, referring to FIGS. 4 and 5, the first power signal lines 1311 and the second power signal lines 1312 form the grid structure in the non-display area 120 and are electrically connected by the overlapping part 1313 of the grid structure.

The first direction X intersects with the second direction Y In a case where the first power signal lines 1311 extend in the first direction X and the second power signal lines 1312 extend in the second direction Y, on the basis of simplifying the arrangement of the power signal lines 131, the first power signal lines 1311 and the second power signal lines 1312 may form the grid structure in the first display area 132, and are electrically connected through the overlapping parts of the grid structure, so that the power signals can be shunted more times in the non-display area 120, and the power signals flowing into the first display area 132 become more uniform, further improving the display uniformity of the pixel units of the first display area 132, improving the mura phenomenon around the light-transmitting area 110, and improving the display effect around the light-transmitting area 110 of the array substrate.

Exemplarily, referring to FIGS. 4 and 5, the first power signal lines 1311 includes first sub-power signal lines 13111 and second sub-power signal lines 13112. The first sub-power signal lines 13111 and the second sub-power signal lines 13112 are respectively disposed on two sides of the light-transmitting area 110 in the first direction X. At least one of the first sub-power signal lines 13111 or the second sub-power signal lines 13112 extend to the non-display area 120 and form a mesh structure with the second power signal lines 1312 in the non-display area 120. The first direction X is a direction in which a scanning line of the array substrate extends, and the second direction Y is a direction in which a data line of the array substrate extends.

The first direction X is a column direction of the array substrate, the first power signal lines 1311 may be the power signal lines disposed on the source and drain layer, and the second power signal lines 1312 may be the metal traces disposed in the capacitive metal layer and extend along a row direction of the array substrate. The first power signal lines 1311 break in the non-display area 120, and in the case where the first sub-power signal lines 13111 extend in the non-display area 120, the first sub-power signal lines 13111 may form a mesh structure with the second power signal lines 1312 at a side of the light-transmitting area 110 facing away from the second sub-power signal lines 13112. In the case where the second sub-power signal lines 13112 extend in the non-display area 120, the second sub-power signal lines 13112 may form a mesh structure with the second power signal lines 1312 at a side of the light-transmitting area 110 facing away from the first sub-power signal lines 13111. The mesh structure of the non-display area 120 may enable the relative uniformity of the power signals flowing into the pixel units connected to the first sub-power signal lines 13111 or the pixel units connected to the second sub-power signal lines 13112, thereby improving the display uniformity of the display area at a side of the light-transmitting area 110 in the first direction X, improving the mura phenomenon around the light-transmitting area 110, and further improving the display effect around the light-transmitting area 110 of the array substrate.

In addition, the first sub-power signal lines 13111 and the second sub-power signal lines 13112 may both extend to the non-display area 120, so that the first sub-power signal lines 13111 and the second sub-power signal lines 13112 respectively form the grid structures on two sides of the light-transmitting area 110 in the first direction X, thereby improving the display uniformity of the display area on both sides of the light-transmitting area 110 in the first direction X simultaneously, further improving the mura phenomenon around the light-transmitting area 110, and improving the display effect around the light-transmitting area 110 of the array substrate.

Referring to FIGS. 4 and 5, the data line includes first data lines 134, the first data lines 134 include first sub-data lines 1341, second sub-data lines 1342 and third sub-data lines 1343. In the first direction X, the first sub-data lines 1341 and the third sub-data lines 1343 are respectively disposed on two sides of the light-transmitting area, the second sub-data lines 1342 are disposed around the non-display area 120, and the first sub-data lines 1341 are electrically connected to the third sub-data lines 1343 through the second sub-data lines 1342. In the second direction Y, for a first sub-power signal line 13111, a first sub-data line 1341 and a second sub-data line 1342 that are provided for pixels in the same column, an extension end of the first sub-power signal line 13111 and an intersection point A of the first sub-data line 1341 and the second sub-data line 1342 are in the same line, and/or for a second sub-power signal line 13112, a third sub-data line 1343 and a second sub-data line 1342, an extension end of the second sub-power signal line 13112 and an intersection point B of the third sub-data line 1343 and the second sub-data line 1342 are in the same line.

The first power signal lines 1311 and the first data lines 134 are disposed at intervals in the second direction Y. One column of pixel units is electrically connected to one first power signal line 1311 and one first data line 134 simultaneously, the one first power signal line 1311 provides the power signals for the one column of pixel units and the one first data line 134 provides data signals for the one column of pixel units. The first sub-data lines 1341 and the third sub-data lines 1343 on two sides of the light-transmitting area 110 are electrically connected by the second sub-data lines 1342 disposed around the non-display area 120. In the case where the first sub-power signal lines 13111 extend to the non-display area 120, for the first sub-power signal line 13111, the first sub-data line 1341 and the second sub-data line 1342 that are provided for the pixels in the same column, the extension end of the first sub-power signal line 13111 and the intersection point A of the first sub-data line 1341 and the second sub-data line 1342 are in the same line. On the basis of ensuring a spacing between the signal lines, the first sub-power signal lines 13111 extend to the longest length, so that the first sub-power signal lines 13111 and the second power signal lines 1312 can have more overlapping parts in the grid structure in the non-display area 120. In this way, the power signals flowing into the display area around the light-transmitting area 110 can be more uniform, thereby improving the display uniformity of the array substrate, improving the mura phenomenon around the light-transmitting area 110, and improving the display effect around the light-transmitting area 110 of the array substrate. In the case where the second sub-power signal lines 13112 extend to the non-display area 120, for the second sub-power signal line 13112, the third sub-data line 1343 and the second sub-data line 1342 that are provided for the pixels in the same column, the extension end of the second sub-power signal line 13112 and the intersection point B of the third sub-data line 1343 and the second sub-data line 1342 are in the same line in the second direction Y. On the basis of ensuring the spacing between the signal lines, the second sub-power signal lines 13112 extend to the longest length, so that the second sub-power signal lines 13112 and the second power signal lines 1312 can have more overlapping parts in the grid structure in the non-display area 120, so that the power signals flowing into the display area around the light-transmitting area 110 can be more uniform, thereby improving the display uniformity of the array substrate, improving the mura phenomenon around the light-transmitting area 110, and improving the display effect around the light-transmitting area 110 of the array substrate. Alternatively, in the second direction Y, for the first sub-power signal line 13111, the first sub-data line 1341 and the second sub-data line 1342 that are provided for the pixels in the same column, the extension end of the first sub-power signal line 13111 and the intersection point A of the first sub-data line 1341 and the second sub-data line 1342 are in the same line, and for the second sub-power signal line 13112, the third sub-data line 1343 and the second sub-data line 1342 that are provided for the pixels in the same column, the extension end of the second sub-power signal line 13112 and the intersection point B of the third sub-data line 1343 and the second sub-data line 1342 are in the same line, so that the first sub-power signal lines 13111 and the second power signal lines 1312, and the first sub-power signal lines 13111 and the second power signals line 1312 can have more overlapping parts in the grid structures in the non-display area 120 simultaneously. In this way, the power signals flowing into the display area around the light-transmitting area 110 are more uniform, improving the mura phenomenon around the light-transmitting area 110, and improving the display effect around the light-transmitting area 110 of the array substrate.

Figure 6:
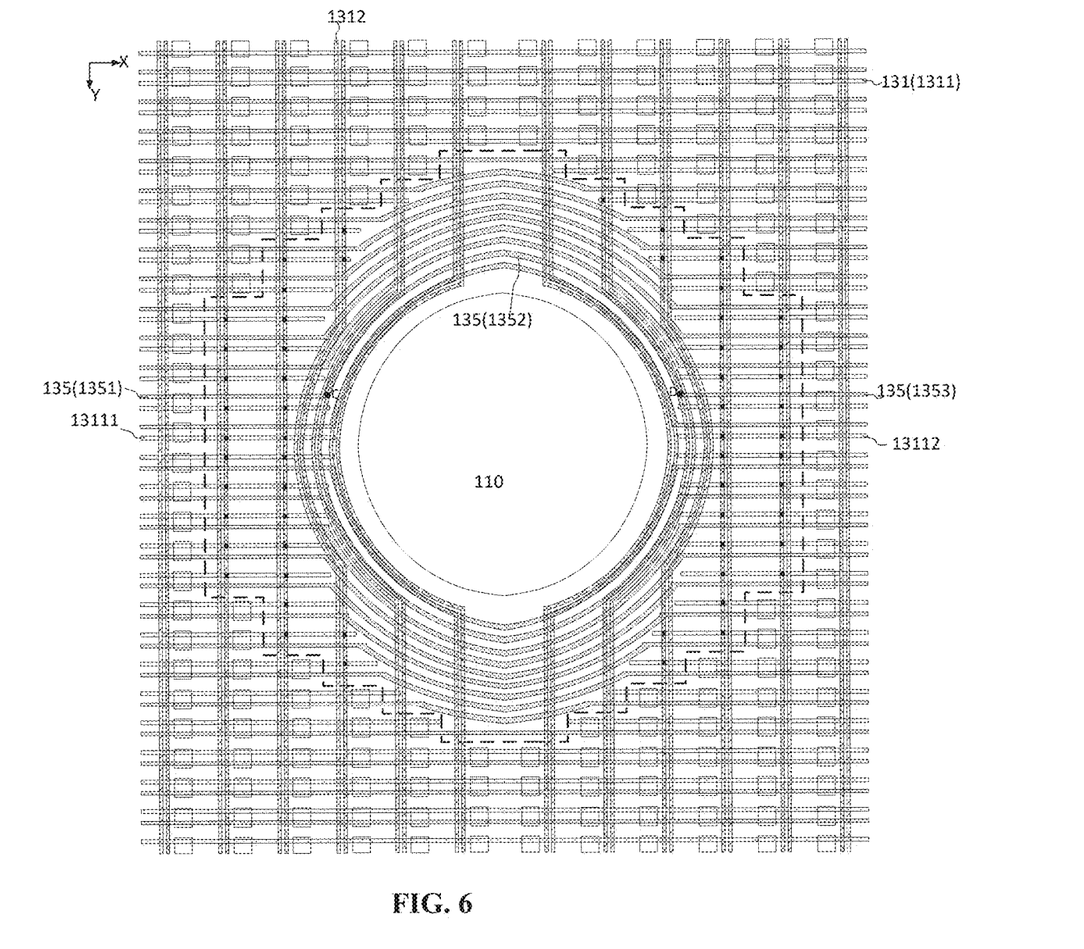
FIG. 6 is a top view of another array substrate provided by an embodiment of the present disclosure.
Figure 7:
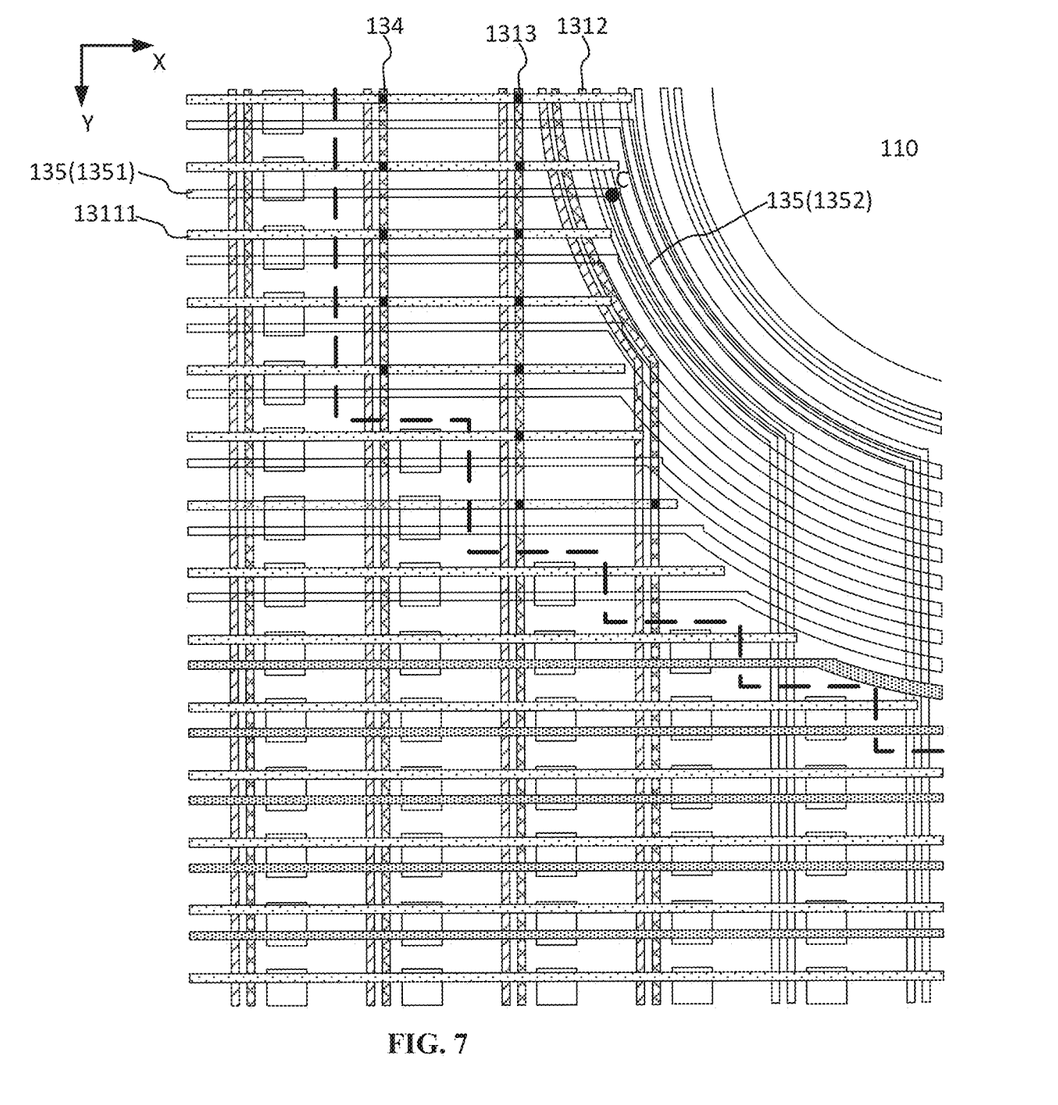
FIG. 7 is a partial enlarged view of FIG. 6.

FIG. 6 is a top view of another array substrate provided by an embodiment of the present disclosure. FIG. 7 is a partial enlarged view of FIG. 6. As shown in FIGS. 6 and 7, the first power signal lines 1311 includes first sub-power signal lines 13111 and second sub-power signal lines 13112. The first sub-power signal lines 13111 and the second sub-power signal lines 13112 are respectively disposed on two sides of the light-transmitting area 110 in the first direction X. At least one of the first sub-power signal lines 13111 or the second sub-power signal lines 13112 extend to the non-display area 120 and form a mesh structure with the second power signal lines 1312 in the non-display area 120. The first direction X is a direction in which a scanning line of the array substrate extends, and the second direction Y is a direction in which a data line of the array substrate extends.

The first direction X is a row direction of the array substrate, and the second direction Y is a column direction of the array substrate. The first power signal lines 1311 may be metal traces disposed in the capacitive metal layer, and the second power signal lines 1312 may be power signal lines disposed in the source and drain layer. The first power signal lines 1311 break in the non-display area 120, and In the case where the first sub-power signal lines 13111 extend in the non-display area 120, the first sub-power signal lines 13111 may form a mesh structure with the second power signal lines 1312 on a side of the light-transmitting area 110 facing away from the second sub-power signal line 13112. In the case where the second sub-power signal lines 13112 extend in the non-display area 120, the second sub-power signal lines 13112 may form a mesh structure with the second power signal lines 1312 on a side of the light-transmitting area 110 facing away from the first sub-power signal lines 13112. The mesh structure of the non-display area 120 may enable the relative uniformity of power signals flowing into the pixel units connected to the first sub-power signal lines 13111 or the pixel units connected to the second sub-power signal lines 13112, thereby improving the display uniformity of the display area at a side of the light-transmitting area 110 in the first direction X, improving the mura phenomenon around the light-transmitting area 110, and further improving the display effect around the light-transmitting area 110 of the array substrate.

Similarly, the first sub-power signal lines 13111 and the second sub-power signal lines 13112 may both extend to the non-display area 120, so that the first sub-power signal lines 13111 and the second sub-power signal lines 13112 respectively form the grid structures on two sides of the light-transmitting area 110 in the first direction X, thereby improving the display uniformity of the display area at the two sides of the light-transmitting area 110 in the first direction X, further improving the mura phenomenon around the light-transmitting area 110, and improving the display effect around the light-transmitting area 110 of the array substrate.

Referring to FIGS. 6 and 7, the scanning line includes first scanning lines 135, the first scanning lines 135 include first sub-scanning lines 1351, second sub-scanning lines 1352, and third sub-scanning lines 1353. The first sub-scanning lines 1351 and the third sub-scanning lines 1353 are respectively disposed on two sides of the light-transmitting area 110 in the first direction X, the second sub-scanning lines 1352 is disposed around the non-display area 120, and the first sub-scanning lines 1351 and the third sub-scanning lines 1353 are electrically connected through the second sub-scanning lines 1352. In the second direction Y, for a first sub-power signal line 13111, a first sub-scanning line 1351 and a second sub-scanning line 1352 that are provided for pixels in the same row, an extension end of the first sub-power signal line 13111 and an intersection point C of the first sub-scanning line 1351 and the second sub-scanning line 1352 are in the same line, and/or for a second sub-power signal line 13112, a third sub-scanning line 1353 and a second sub-scanning line 1352 that are provided for pixels in the same row, an extension end of the second sub-power signal line 13112 and an intersection point D of the third sub-scanning line 1353 and the second sub-scanning line 1352 are in the same line.

The first power signal lines 1311 and the first scanning lines 135 are disposed at intervals in the second direction Y. One row of pixel units is electrically connected to one first power signal line 1311 and one first scanning line 135 simultaneously, the one first power signal line 1311 provides the power signals for the one row of pixel units, and the one first scan line 135 provides scanning signals for the one row of pixel units. The first sub-scanning lines 1351 and the third sub-scanning lines 1353 on two sides of the light-transmitting area 110 are electrically connected by the second sub-scanning lines 1352 disposed around the non-display area 120. In the case where the first sub-power signal lines 13111 extend to the non-display area 120, in the second direction Y, for the first sub-power signal line 13111, the first sub-scanning line 1351 and the second sub-scanning line 1352 that are provided for pixels in the same row, the extension end of the first sub-power signal line 13111 and the intersection point C of the first sub-scanning line 1351 and the second sub-scanning line 1352 are in the same line. On the basis of ensuring a spacing between the signal lines, the first sub-power signal lines 13111 extend to the longest length, so that the first sub-power signal lines 13111 and the second power signal lines 1312 can have more overlapping parts in the grid structure in the non-display area 120. In this way, the power signals flowing into the display area around the light-transmitting area 110 can be more uniform, thereby improving the display uniformity of the array substrate, improving the mura phenomenon around the light-transmitting area 110, and improving the display effect around the light-transmitting area 110 of the array substrate. In the case where the second sub-power signal lines 13112 extend to the non-display area 120, in the second direction Y, for the second sub-power signal line 13112, the third sub-scanning line 1353 and the second sub-scanning line 1352 that are provided for pixels in the same row, the extension end of the second sub-power signal line 13112 and the intersection point D of the third sub-scanning line 1353 and the second sub-scanning line 1352 are in the same line. On the basis of ensuring the spacing between the signal lines, the second sub-power signal lines 13112 extend to the longest length, so that the second sub-power signal lines 13112 and the second power signal lines 1312 can have more overlapping parts in the grid structure in the non-display area 120. In this way, the power signals flowing into the display area around the light-transmitting area 110 can be more uniform, thereby improving the display uniformity of the array substrate, improving the mura phenomenon around the light-transmitting area 110, and improving the display effect around the light-transmitting area 110 of the array substrate. Alternatively, in the second direction Y, the first sub-power signal lines 13111 and the second sub-power signal lines 13112 both extend to the longest length in the non-display area 120, so that the first sub-power signal lines 13111 and the second power signal lines 1312, as well as the second sub-power signal lines 13112 and the second power signal lines 1312, have more overlapping parts in the grid structure in the non-display area 120. In this way, the power signals flowing into the display area around the light-transmitting area 110 are more uniform, improving the mura phenomenon around the light-transmitting area 110, and improving the display effect around the light-transmitting area 110 of the array substrate.

On the basis of the preceding technical solutions, the first power signal line and the second power signal line are electrically connected through a via hole 140 in the non-display area.

Since the first power signal line and the second power signal line are located at different metal layers of the array substrate, a via hole 140 may be disposed at the overlapping part of the first power signal line and the second power signal line, so that electrical connection between the first power signal line and the second power signal line is achieved by the via hole 140. In this way, the first power signal lines and the second power signal lines form the grid structure in the non-display area, improving the display uniformity of the power signals in the display area around the light-transmitting area, improving the mura phenomenon around the light-transmitting area, and further improving the display effect around the light-transmitting area of the array substrate.

In an embodiment, the array substrate includes a capacitive layer. The second power signal lines are disposed in the capacitive layer, and the first power signal lines are disposed in the same layer as the data line, or the second power signal lines are disposed in the same layer as the data line, and the first power signal lines are disposed in the capacitive layer.

In the case where the first direction is a direction in which the data line of the array substrate extends, and the second direction is a direction in which the scanning line of the array substrate extends, the first power signal lines and the data line may be disposed in the same layer, and the second power signal lines may be disposed in the capacitive layer. In the case where the first direction is the direction in which the scanning line of the array substrate extends, and the second direction is a direction in which the data line of the array substrate extends, the first power signal lines may be disposed in the capacitive layer, and the second power signal lines and the data line may be disposed in the same layer. In this way, separately providing the metal layer for the power signal lines can be avoided, thereby simplifying the manufacturing process of the array substrate.

Figure 8:
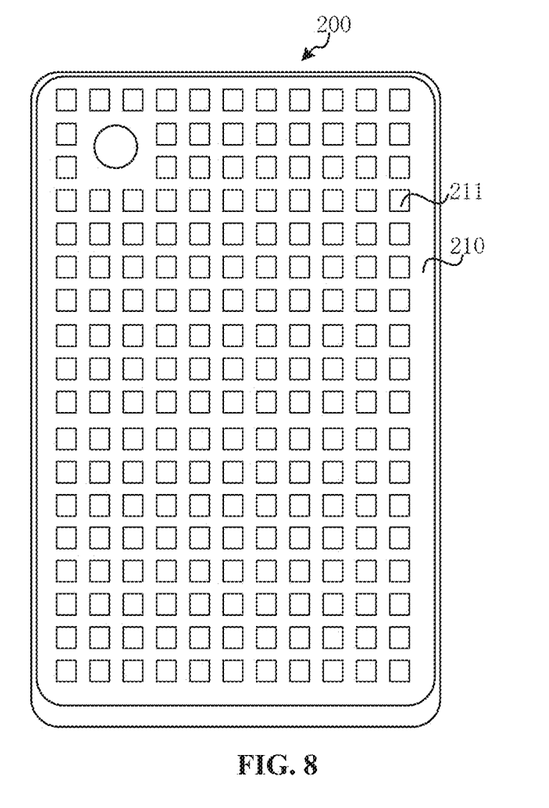
FIG. 8 is a schematic structural diagram of a display panel provided by an embodiment of the present disclosure.

An embodiment of the present disclosure further provides a display panel. FIG. 8 is a schematic structural diagram of a display panel provided by an embodiment of the present disclosure. As shown in FIG. 8, the display panel 200 includes the array substrate 210 of any embodiment of the present disclosure. The array substrate 210 is provided with a light-emitting device 211 for implementing the illumination of the display panel 200.

Figure 9:
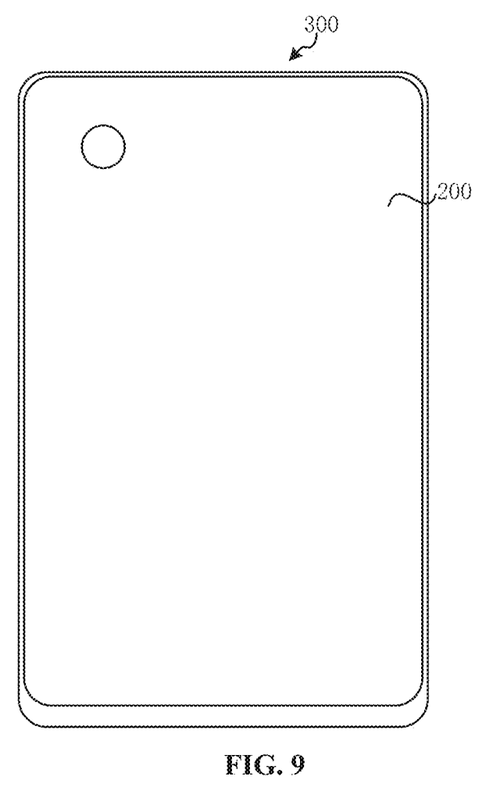
FIG. 9 is a schematic structural diagram of a display device provided by an embodiment of the present disclosure.

An embodiment of the present disclosure further provides a display device. FIG. 9 is a schematic structural diagram of a display device provided by an embodiment of the present disclosure. As shown in FIG. 9, the display device 300 includes the display panel 200 of any embodiment of the present disclosure.

What is claimed is:

1. An array substrate, comprising:
   a light-transmitting area;
   a non-display area around the light-transmitting area;
   a display area around the non-display area;
   a plurality of data lines; and
   a capacitive layer;
   wherein the display area comprises a plurality of power signal lines which comprises a plurality of first power signal lines and a plurality of second power signal lines, the plurality of first power signal lines extends in a first direction, the plurality of second power signal lines extends in a second direction, the plurality of first power signal lines extends to the non-display area, the plurality of second power signal lines is disposed around the light-transmitting area through the non-display area, and is electrically connected to the plurality of first power signal lines in the non-display area, the first direction intersects with the second direction, the plurality of second power signal lines is disposed in the capacitive layer, the plurality of first power signal lines is disposed in a same layer as the plurality of data lines; or
   the plurality of second power signal lines is disposed in a same layer as the plurality of data lines, and the plurality of first power signal lines is disposed in the capacitive layer.

2. The array substrate of claim 1, wherein the plurality of first power signal lines and the plurality of second power signal lines form a grid structure in the non-display area and are electrically connected through overlapping parts of the grid structure.

3. The array substrate of claim 2, wherein the plurality of first power signal lines comprises a plurality of first sub-power signal lines and a plurality of second sub-power signal lines; the plurality of first sub-power signal lines and the plurality of second sub-power signal lines are respectively disposed on two sides of the light-transmitting area in the first direction; at least one of the plurality of first sub-power signal lines or the plurality of second sub-power signal lines extend to the non-display area and form a mesh structure with the plurality of second power signal lines in the non-display area, wherein the first direction is a direction in which the plurality of data lines of the array substrate extend, and the second direction is a direction in which a plurality of scanning lines of the array substrate extend.

4. The array substrate of claim 3, wherein the plurality of data lines comprise a plurality of first data lines, the plurality of first data lines comprise a plurality of first sub-data lines, a plurality of second sub-data lines, and a plurality of third sub-data lines; the plurality of first sub-data lines and the plurality of third sub-data lines are respectively disposed on two sides of the light-transmitting area in the first direction, the plurality of second sub-data lines are disposed around the non-display area, and the plurality of first sub-data lines are electrically connected to the plurality of third sub-data lines through the plurality of second sub-data lines; for one of the plurality of first sub-power signal lines, one of the plurality of first sub-data lines and one of the plurality of second sub-data lines that are provided for a same column of pixel units, an extension end of the one of the plurality of first sub-power signal lines and an intersection point of the one of the plurality of first sub-data lines and the one of the plurality of second sub-data lines are in a same line in the second direction, and/or for one of the plurality of second sub-power signal lines, one of the plurality of third sub-data lines and one of the plurality of second sub-data lines that are provided for a same column of pixel units, an extension end of the one of the plurality of second sub-power signal lines and an intersection point of the one of the plurality of third sub-data lines and the one of the plurality of second sub-data lines are in a same line in the second direction.

5. The array substrate according to claim 2, wherein the plurality of first power signal lines comprise a plurality of first sub-power signal lines and a plurality of second sub-power signal lines; the plurality of first sub-power signal lines and the plurality of second sub-power signal lines are respectively disposed on two sides of the light-transmitting area along the first direction; at least one of the plurality of first sub-power signal lines or the plurality of second sub-power signal lines extend to the non-display area and form a mesh structure with the plurality of second power signal lines in the non-display area, wherein the first direction is a direction in which a plurality of scanning lines of the array substrate extend, and the second direction is a direction in which the plurality of data lines of the array substrate extend.

6. The array substrate of claim 5, wherein the plurality of scanning lines comprise a plurality of first scanning lines, the plurality of first scanning lines comprise a plurality of first sub-scanning lines, a plurality of second sub-scanning lines, and a plurality of third sub-scanning lines; the plurality of first sub-scanning lines and the plurality of second sub-scanning lines are disposed on two sides of the light-transmitting area in the first direction, the plurality of second sub-scanning lines are disposed around the non-display area, and the plurality of first sub-scanning lines are electrically connected to the plurality of third sub-scanning lines through the plurality of second sub-scanning lines; for one of the plurality of first sub-power signal lines, one of the plurality of first sub-scanning lines and one of the plurality of second sub-scanning lines that are provided for a same row of pixel units, an extension end of the one of the plurality of first sub-power signal lines and an intersection point of the one of the plurality of first sub-scanning lines and the one of the plurality of second sub-scanning lines are in a same line in the second direction, and/or for one of the plurality of second sub-power signal lines, one of the plurality of third sub-scanning lines and one of the plurality of second sub-scanning lines that are provided for a same row of pixel units, an extension end of the one of the plurality of second sub-power signal lines and an intersection point of the one of the plurality of third sub-scanning lines and the one of the plurality of second sub-scanning lines are in a same line in the second direction.

7. The array substrate of claim 1, wherein the light-transmitting area is a through-hole area, and the array substrate has a through hole in the light-transmitting area.

8. The array substrate of claim 1, wherein the display area includes a first display area and a second display area, the first display area is on a side of the light-transmitting area facing away from a side into which power signals flow, and the second display area is in the display area other than the first display area.

9. The array substrate of claim 4, wherein the plurality of first power signal lines and the plurality of first data lines are disposed at intervals in the second direction.

10. The array substrate of claim 4, wherein each column of pixel units is electrically connected to a respective one of the plurality of first power signal lines and a respective one of the plurality of first data lines, the respective one of the plurality of first power signal lines provides a power signal for the each column of pixel units, and the respective one of the plurality of first data lines provides a data signal for the column of pixel units.

11. The array substrate of claim 6, wherein the plurality of first power signal lines and the plurality of first scanning lines are disposed at intervals in the second direction.

12. The array substrate of claim 6, wherein each row of pixel units is electrically connected to a respective one of the plurality of first power signal lines and a respective one of the plurality of first scanning lines, the respective one of the plurality of first power signal lines provides a power signal for the column of pixel units, and the respective one of the plurality of first scanning lines provides a scanning signal for the column of pixel units.

13. The array substrate of claim 1, wherein when the first direction is a direction in which the plurality of data lines of the array substrate extend and the second direction is a direction in which a plurality of scanning lines of the array substrate extend, the plurality of first power signal lines are disposed in a same layer as the plurality of data lines and the plurality of second power signal lines are disposed in the capacitive layer; and when the first direction is a direction in which the plurality of scanning lines of the array substrate extend and the second direction is a direction in which the plurality of data lines of the array substrate extend, the plurality of first power signal lines are disposed in the capacitive layer and the plurality of second power signal lines are disposed in a same layer as the plurality of data lines.

14. A display panel, comprising: the array substrate of claim 1.

15. The array substrate of claim 1, wherein a first power signal line is electrically connected to a second power signal line through a via hole in the non-display area, and the via hole is disposed at an overlapping part of the first power signal line and the second power signal line.

16. An array substrate, comprising:
a light-transmitting area;
a non-display area around the light-transmitting area; and
a display area around the non-display area,
wherein the display area comprises a plurality of power signal lines; the plurality of power signal lines comprise a plurality of first power signal lines and a plurality of second power signal lines; the plurality of first power signal lines extend in a first direction and the plurality of second power signal lines extend in a second direction; the plurality of first power signal lines extend to the non-display area, the plurality of second power signal lines are disposed around the light-transmitting area through the non-display area, and are electrically connected to the plurality of first power signal lines in the non-display area, wherein the first direction intersects with the second direction;
wherein the plurality of first power signal lines and the plurality of second power signal lines form a grid structure in the non-display area and are electrically connected through overlapping parts of the grid structure;
wherein the plurality of first power signal lines comprises a plurality of first sub-power signal lines and a plurality of second sub-power signal lines; the plurality of first sub-power signal lines and the plurality of second sub-power signal lines are respectively disposed on two sides of the light-transmitting area in the first direction; at least one of the plurality of first sub-power signal lines or the plurality of second sub-power signal lines extend to the non-display area and form a mesh structure with the plurality of second power signal lines in the non-display area, wherein the first direction is a direction in which a plurality of data lines of the array substrate extend, and the second direction is a direction in which a plurality of scanning lines of the array substrate extend; and
wherein the plurality of data lines comprise a plurality of first data lines, the plurality of first data lines comprise a plurality of first sub-data lines, a plurality of second sub-data lines, and a plurality of third sub-data lines; the plurality of first sub-data lines and the plurality of third sub-data lines are respectively disposed on two sides of the light-transmitting area in the first direction, the plurality of second sub-data lines are disposed around the non-display area, and the plurality of first sub-data lines are electrically connected to the plurality of third sub-data lines through the plurality of second sub-data lines; for one of the plurality of first sub-power signal lines, one of the plurality of first sub-data lines and one of the plurality of second sub-data lines that are provided for a same column of pixel units, an extension end of the one of the plurality of first sub-power signal lines and an intersection point of the one of the plurality of first sub-data lines and the one of the plurality of second sub-data lines are in a same line in the second direction, and/or for one of the plurality of second sub-power signal lines, one of the plurality of third sub-data lines and one of the plurality of second sub-data lines that are provided for a same column of pixel units, an extension end of the one of the plurality of second sub-power signal lines and an intersection point of the one of the plurality of third sub-data lines and the one of the plurality of second sub-data lines are in a same line in the second direction.

17. The array substrate of claim 16, wherein the plurality of first power signal lines and the plurality of first data lines are disposed at intervals in the second direction.

18. The array substrate of claim 16, wherein each column of pixel units is electrically connected to a respective one of the plurality of first power signal lines and a respective one of the plurality of first data lines, the respective one of the plurality of first power signal lines provides a power signal for the each column of pixel units, and the respective one of the plurality of first data lines provides a data signal for the column of pixel units.

* * * * *